(12) United States Patent
Deb et al.

(10) Patent No.: US 6,971,045 B1
(45) Date of Patent: Nov. 29, 2005

(54) REDUCING TESTER CHANNELS FOR HIGH PINOUT INTEGRATED CIRCUITS

(75) Inventors: Biswa M. Deb, Bangalore (IN); Rajat Gupta, Madhavnagar (IN)

(73) Assignee: Cyress Semiconductor Corp., San Jose, CA (US)

(*) Notice: Subject to any disclaimer, the term of this patent is extended or adjusted under 35 U.S.C. 154(b) by 377 days.

(21) Appl. No.: 10/151,669

(22) Filed: May 20, 2002

(51) Int. Cl.[7] ............................................. G06F 11/00
(52) U.S. Cl. ........................................ 714/30; 714/27
(58) Field of Search .................................. 714/27, 30

(56) References Cited

U.S. PATENT DOCUMENTS

| | | | |
|---|---|---|---|
| 3,961,254 A * | 6/1976 | Cavaliere et al. ........... 714/730 |
| 4,348,759 A | 9/1982 | Schnurmann ................. 371/20 |
| 4,402,055 A | 8/1983 | Lloyd et al. ................. 364/579 |
| 4,404,519 A * | 9/1983 | Westcott ..................... 714/736 |
| 4,602,210 A * | 7/1986 | Fasang et al. ............... 714/731 |
| 4,703,484 A * | 10/1987 | Rolfe et al. ................. 714/726 |
| 4,724,379 A | 2/1988 | Hoffman ................... 324/73 R |
| 4,746,855 A | 5/1988 | Wrinn ....................... 324/73 R |
| 4,760,330 A | 7/1988 | Lias, Jr. .................... 324/73 R |
| 4,835,464 A | 5/1989 | Slye et al. ............... 324/158 F |
| 4,972,413 A | 11/1990 | Littlebury et al. .......... 371/22.1 |
| 4,989,209 A | 1/1991 | Littlebury et al. .......... 371/22.1 |
| 5,025,205 A | 6/1991 | Mydill et al. ............... 324/73.1 |
| 5,315,241 A | 5/1994 | Ewers ..................... 324/158 R |
| 5,384,533 A * | 1/1995 | Tokuda et al. ............. 324/158.1 |
| 5,392,297 A * | 2/1995 | Bell et al. .................... 714/734 |
| 5,416,919 A * | 5/1995 | Ogino et al. ................. 714/30 |
| 5,432,797 A | 7/1995 | Takano ......................... 371/27 |
| 5,442,643 A * | 8/1995 | Adachi ........................ 714/733 |
| 5,457,380 A | 10/1995 | Blumenau ................. 324/158.1 |
| 5,479,652 A * | 12/1995 | Dreyer et al. .................. 714/30 |
| 5,481,471 A * | 1/1996 | Naglestad et al. .............. 716/4 |
| 5,525,971 A * | 6/1996 | Flynn ......................... 714/724 |
| 5,553,082 A * | 9/1996 | Connor et al. ............... 714/733 |
| 5,566,186 A | 10/1996 | Paterson et al. ........... 371/25.1 |
| 5,640,404 A | 6/1997 | Satish ........................ 371/22.3 |
| 5,712,858 A | 1/1998 | Godiwala et al. .......... 371/22.1 |
| 5,973,504 A | 10/1999 | Chong ......................... 324/754 |
| 6,073,259 A | 6/2000 | Sartschev et al. ........... 714/724 |
| 6,097,199 A | 8/2000 | Jeng et al. ................... 324/755 |
| 6,122,762 A * | 9/2000 | Kim ........................... 714/726 |
| 6,128,758 A * | 10/2000 | Hall et al. ................... 714/727 |
| 6,134,685 A | 10/2000 | Spano ........................ 714/724 |
| 6,865,701 B1 * | 3/2005 | Youngs et al. .............. 714/718 |
| 6,883,129 B2 * | 4/2005 | Biewenga et al. .......... 714/738 |

OTHER PUBLICATIONS

Palmer et al., "MSI and LSI Elements", Theory and Problems of Introduction to Digital Systems, Schaum's Outline Series, McGraw-Hill, Inc., 1993, p. 133.*

(Continued)

*Primary Examiner*—Robert Beausoliel
*Assistant Examiner*—Gabriel L. Chu
(74) *Attorney, Agent, or Firm*—Christopher P. Maiorana, PC

(57) ABSTRACT

An integrated circuit generally comprising a plurality of input pads, an input circuit, and a core circuit. The input pads may be configured to receive a plurality of first input signals. The input circuit may be configured to generate a plurality of second input signals (i) equal to the first input signals while in an operational mode and (ii) responsive to a plurality of test vectors with timing generation determined by the first signals while in a test mode. The core circuit may be responsive to the second input signals.

19 Claims, 5 Drawing Sheets

OTHER PUBLICATIONS

Katz, "Hierarchically constructed 8:1 multiplexer", Contemporary Logic Design, The Benjamin/Cummings Publishing Company, Inc., 1994, p. 184.*

"High-Performance Circuit Testing with Slow-Speed Testers", By Vishwani D. Agrawal et al., International Test Conference, 1995 IEEE, pp. 302-310.

* cited by examiner

REDUCING TESTER CHANNELS FOR HIGH PINOUT INTEGRATED CIRCUITS

FIELD OF THE INVENTION

The present invention relates to a method and/or architecture for integrated circuit testing generally and, more particularly, to a method and/or architecture for implementing high pinout digital integrated circuits having on-chip circuitry that supports external testers.

BACKGROUND OF THE INVENTION

Test costs of integrated circuits (IC) are progressively threatening to overtake all other manufacturing costs. IC makers are packing a far wider range of functions with large number of pins causing conventional IC testers that have a limited number of test channels to become obsolete. Current technology IC testers operate by classifying IC inputs into different categories, store test patterns in a tester memory buffer, and supply direct current (DC) levels for each of the IC inputs from dedicated tester channels. Appropriate sets of the DC levels are selected through board-level multiplexers for each IC pin. The levels are further controlled by a bit configuration of each test pattern.

Conventional testers become a limiting factor as complexity and pinouts (i.e., a number of pins or bonding pads) of the ICs being tested increases. The finite number of tester channels restricts the number of IC inputs that can be stimulated simultaneously. Furthermore, circuitry implemented within or on the testers on custom boards designed specifically to test a particular device increases time to set up for manufacturing test operations.

SUMMARY OF THE INVENTION

The present invention concerns an integrated circuit generally comprising a plurality of input pads, an input circuit, and a core circuit. The input pads may be configured to receive a plurality of first input signals. The input circuit may be configured to generate a plurality of second input signals (i) equal to the first input signals while in an operational mode and (ii) responsive to a plurality of test vectors with timing generation determined by the first signals while in a test mode. The core circuit may be responsive to the second input signals.

The objects, features and advantages of the present invention include providing a method and/or architecture for an integrated circuit that may (i) optimize use of tester channels, (ii) operate with existing circuitry on tester boards, (iii) provide for reliable testing, (iv) provide for short test times as compared to conventional test times, (v) provide for low test costs as compared to conventional test costs, (vi) accommodate conventional DC and AC parametric testing, (vii) accommodate conventional functional testing and/or (viii) extend IC tester life to support several generations of VLSI integrated circuits.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
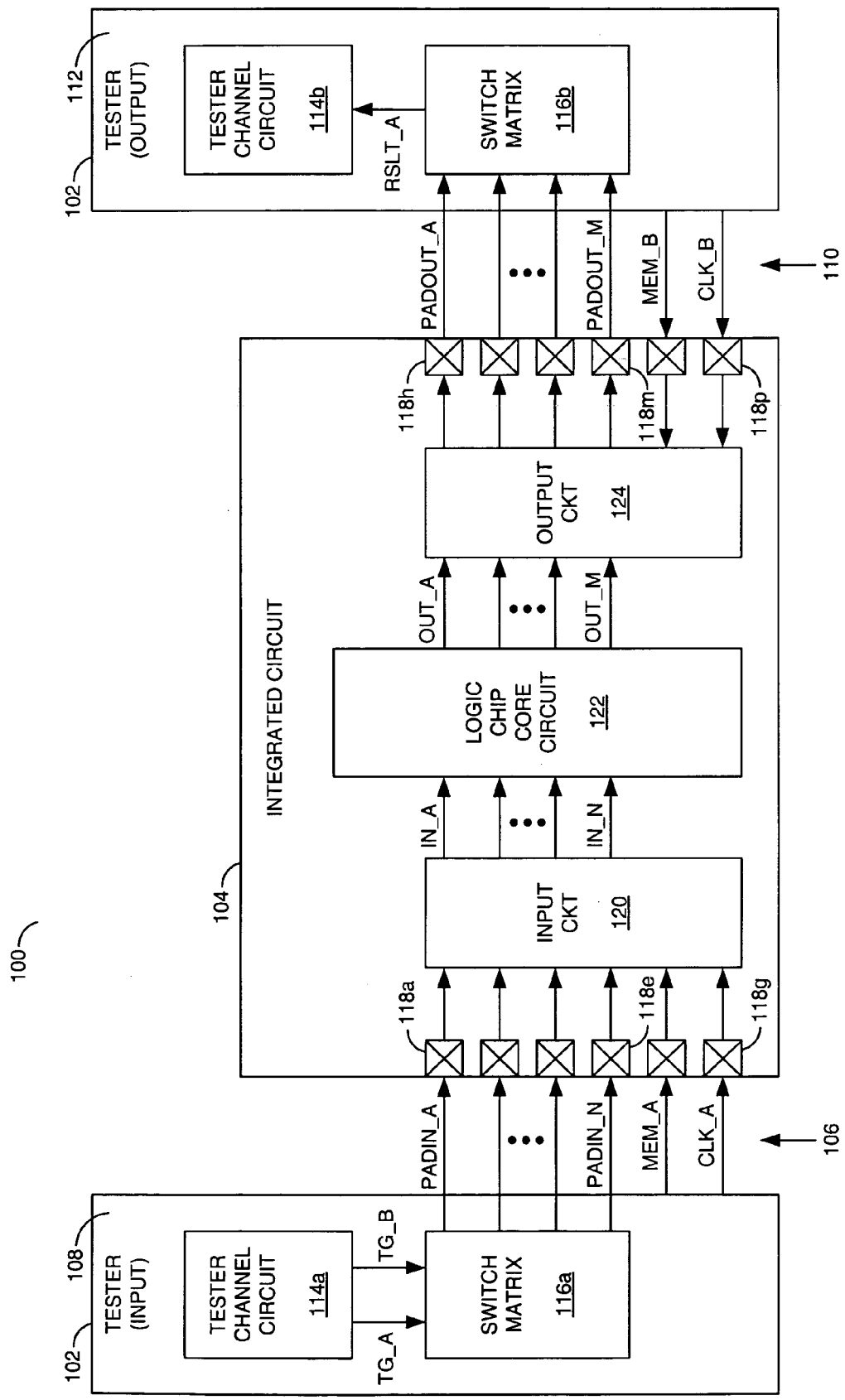
FIG. 1 is a block diagram of an integrated circuit implementing the present invention in a test system.

Referring to FIG. 1, a block diagram of a system 100 is shown in accordance with a preferred embodiment of the present invention. The system 100 generally comprises a tester 102 (shown in two places) and a device under test 104. The tester 102 may be an integrated circuit tester. The device under test 104 may be an integrated circuit (IC).

In one embodiment, the IC 104 may be implemented as a very large scale integration (VLSI) integrated circuit such as a programmable logic circuit, application specific integrated circuits, mixed signal devices, large gate array circuits or the like. In another embodiment, the IC 104 may be implemented as an ultra large scale integration (ULSI) integrated circuit. In still another embodiment, the IC 104 may be implemented as a system on a chip (SOC) integrated circuit. The IC 104 may be implemented as other types of circuits and/or systems to meet the design criteria of a particular application.

Multiple interfaces 106 may couple an input portion 108 of the IC tester 102 to the IC 104 under test. Additional interfaces 110 may couple an output portion 112 of the IC tester 102 to the IC 104 under test. Other interfaces (not shown) may be provided in the IC 104 to accommodate power, ground, clocks, references and/or similar signals.

The input portion 108 of the IC tester 102 may generate and present one or more signals (e.g., PADIN_A through PADIN_N) through the interface 106 to the IC 104. The signals PADIN_A–N may stimulate the IC 104 to cause one or more tests to be performed. The output portion 112 of the IC tester 102 may receive one or more signals (e.g., PADOUT_A through PADOUT_M) through the interface 110. The signals PADOUT_A–M may show responses of the IC 104 to the tests performed.

In general, the signals PADIN_A–N may be implemented as input signals. The signals may also be implemented as digital, analog, reference, power, clocking, timing, pulse, trigger and/or similar signals. Other types of signals may be presented to and read from the IC 104 to meet the design criteria of a particular application and/or test.

The tester 102 may perform a variety of tests on the IC 104. For example, the tester 102 may conduct static or DC type parametric tests, dynamic or AC type parametric tests, functional tests, stress tests and/or the like. The IC 104 may be designed to allow for testing with a lower number of channels in the tester 102 than would conventionally be used to perform the tests. As a result, the present invention may extend a useful life of the tester 102 to several generations of integrated circuits.

The tester 102 generally comprises multiple tester channel circuits 114a–k (only two shown for clarity) and a switching matrix 116 of which two parts are shown as 116a and 116b. Some or all of the tester channel circuits 114a–k may generate and present test signals (e.g., TG_A through TB_J, with only TB_A and TG_B shown for clarity) of voltages and/or currents to stimulate the IC 104. Some or all of the tester channel circuits 114a–k may sense voltages, currents, frequency, capacitance, inductance, resistance and/ or other parameters. Some tester channel circuits 114a–k may generate the test signals TG_A–J and analyze received signals. The test signals TG_A–J may be generated to provide timing information and/or test vectors information.

The switching matrix 116a may provide for routing of one or more test signals TG_A–J to one or more inputs of the IC 104. The switching matrix 116b may provide for routing the signals PADOUT_A–M from the IC 104 to the tester channel circuit 114b as result signals (e.g., RSLT_A through RSLT_L, with only RSLT_A shown for clarity). Control of the switching matrix 116 may be provided by on-board jumpers, external signals, or by other compatible means.

The switching matrix 116a may connect each of the test signals TG_A–J to a respective cluster of the input signals PADIN_A–N. Each cluster may have a single or multiple input signals PADIN_A–N that share common timing information. The common timing information is generally provided by the test signals TG_A–J. Because a single test signal TG may be connected to a cluster of several input signals PADIN_A–N, the switching matrix 116a may reduce a number of the tester channel circuits 114 below a number of the input signals PADIN_A–N. Operating with a low number of tester channel circuits 114 generally allows for an efficient use of the input portion 108 of the tester 102.

As an example use of the switching matrix 116a, the test signal TG_A from the tester channel circuit 114a may be connected multiple input signals PADIN_A–D of the IC 104. The input signals PADIN_A–D may therefore have similar timing information as supplied by the test signal TG_A. Likewise, a second set of input signals PADIN_E–G may use different timing information and thus may be based upon the test signal TG_B. A third set of input signals PADIN_H–N may use still different timing information and thus may be connected to the test signal TG_C. Other clusters of the input signals PADIN_A–N with the test signals TG_A–J may be provided to meet the criteria of a particular test.

The switching matrix 116a may also be useful to increase an effective rate of the tester 102. In general, the pins released by clustering may be multiplexed to produce faster transitioning signals than through a single pin alone. For example, a 2-way switch (not shown) may allow a 50 megahertz (MHz) tester 102 to generate a 100 MHz signal by booking two test channels 114a–k for each pin or cluster of the IC 104.

The tester 102 may also generate and present one or more clock signals (e.g., CLK_A through CLK_J) to the IC 104 (only two are shown for clarity). The clock signals CLK_A–J may be used by the IC 104 to aid in conducting tests. The tester 102 may also generate and present multiple memory-type signals (e.g., MEM_A through MEM_J) to the IC 104 (only two are shown for clarity). The memory-type signals MEM_A–J may provide address, data and control signals to write test vectors and other data to the IC 104 to support testing. Storing the test vectors on-chip with a logic chip core circuit 122 generally results in improved reliability in transferring the test vector information to the logic chip core circuit 122 and may increase maximum transfer speeds.

The IC 104 generally comprises multiple bonding pads 118a–p, an input circuit 120, the logic chip core circuit 122 and an optional output circuit 124. For a packaged IC 104, the bonding pads 118a–p may be connected to pins, balls, tabs, solder bumps, pad or connections on a ball grid array substrate or the like. Testing of the IC 104 by the tester 102 may be conducted at the wafer level, individual chip level, substrate level and/or packaged level.

The IC 104 generally has a large number of the bonding pads 118a–p. For example, the IC 104 may have hundreds to thousands of bonding pads 118a–p, with current devices having more than 2000 pins. Fortunately, a number of timing generators that input signals to and receive signals from the IC 104 may be generally a much smaller number. During functional testing, many bonding pads 118a–p that have similar timing generation may be shorted or coupled together by the switching matrixes 116a–k of the tester 102 resulting in small clusters. Each cluster may be driven by a single tester channel circuit 114x (where $a \leq x \leq k$) of the tester 102. The clustering approach may compress, for example, a 500-pin IC 104 to a 25-pin device as seen by the tester 102.

From input bonding pads 118a–g, the signals PADIN_A–N may be routed to the input circuit 120. The input circuit 120 may generate input signals (e.g., IN_A through IN_N) that are dependent upon a mode of operation. For example, the input circuit 120 may pass through the signals PADIN_A–N unaltered as the input signals IN_A–N while in an operational mode. In a test mode, the input circuit 120 may generate the input signals IN_A–N as determined by test vectors and the signals PADIN_A–N. The signals PADIN_A–N may be used in the test mode for timing generation of the input signals IN_A–N. Therefore, each of the input signals IN_A–N of a particular cluster may transition simultaneously in response to a particular signal PADIN_Y (where $A \leq Y \leq N$). Furthermore, the test vectors may include patterns that may prevent appropriate input signals IN_A–N from transitioning with the particular signal PADIN_Y.

The logic chip core circuit 122 generally responds to the input signals IN_A–N by performing one or more commanded functions and/or halting one or more ongoing functions. The functions may generate and present multiple output signals (e.g., OUT_A through OUT_M). The output signals OUT_A–M may be routed to an output circuit 124.

The output circuit 124 may generate the signals PADOUT_A–M that are dependent on a mode of operation of the output circuit 124. In an operational mode, the output circuit 124 may pass through the output signals OUT_A–M unaltered as the signals PADOUT_A–M. In a test mode, the output circuit 124 may compare information in the output signals OUT_A–M to test vectors programmed with expected results. If the information in the output signals OUT_A–M match the expected results of the test vectors, the output circuit 124 may generate a comparison result in a pass state. If the information in the output signals OUT_A–M does not match the expected results, the output circuit 124 may generate the comparison result in a fail state. The comparison result may be placed in one or more of the signals PADOUT_A–M for transfer back to the tester 102.

The signals PADOUT_A–M are generally routed to appropriate output bonding pads 118h–m for presentation through the interface 110 external to the IC 104. The signals PADOUT_A–M may be received by the switching matrix 116b of the tester 102. The switching matrix 116b may interconnect one or more of the signals PADOUT_A–M and thus the associated bonding pads 118h–m for presentation of the results signals RSLT_A–L to the tester channel circuit 114b. While the output circuit 124 operates in the test mode, the tester 102 generally only allocates a single tester channel circuit 114a–k to each cluster of output signals PADOUT_A–M for reading the pass/fail status generated by the output circuit 124.

Figure 2:
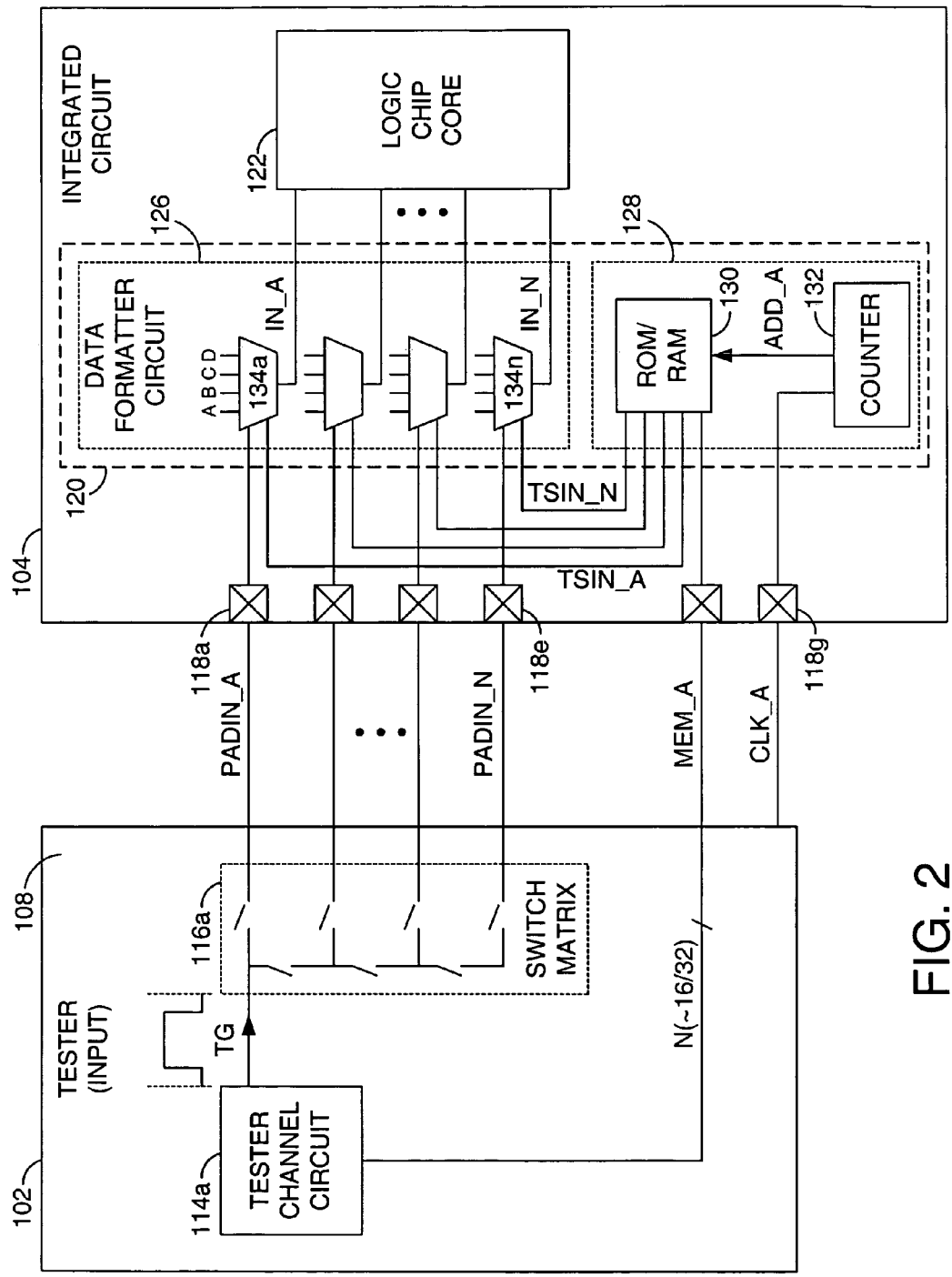
FIG. 2 is a block diagram of an input portion of the integrated circuit.

Referring to FIG. 2, a detailed block diagram of a portion of the IC 104 is shown. The input circuit 120 of the integrated circuit 104 generally comprises a circuit 126 and a circuit 128. The circuit 126 may be implemented as a data formatter circuit. The circuit 128 may be implemented as a test vector generator circuit 128. The test vector generator circuit 128 may provide the IC 104 with a built-in self test capability. The data formatter circuit 126 may support the test vector generator circuit 128 in providing test vector information to the logic chip core circuit 122.

The test vector generator circuit 128 may receive a clock signal from the tester 102, for example the clock signal CLK_A. The test vector generator circuit 128 may also receive a memory signal from the tester 102, for example the memory signal MEM_A. The memory signal MEM_A may be used to write test vector information into the test vector generator circuit 128 from the tester 102. The clock signal CLK_A may provide support for writing the test vector information.

The test vector generator circuit 128 may generate multiple test signals (e.g., TSIN_A through TSIN_N). The test signals TSIN_A–N may convey the test vectors stored in the test vector generator circuit 128 to the data formatter circuit 126. Timing of the test signals TSIN_A–N may be determined by the clock signal CLK_A.

The data formatter circuit 126 may generate the input signals IN_A–N based upon the signals PADIN_A–N, the test signals TSIN_A–N and the operational/test mode on a per-pin basis. While in the operational mode, the data formatter circuit 126 may generate the input signals IN_A–N equal to the signals PADIN_A–N. While in the test mode, the data formatter circuit 126 may generate the input signals IN_A–N based upon the test vector information in the test signals TSIN_A–N with timing generation determined by the signals PADIN_A–N. While the switching matrix 116A interconnects the signals PADIN_A–N and the associated bonding pads 118a–e together, the signals PADIN_A–N are identical. In some tests, the switching matrix 116a and/or the test signals TSIN_A–N may be arranged to effectively isolate one or more of the signals PADIN_A–N from the cluster. For DC and AC parametric testing, an onboard switching circuit (FIG. 5) may be provided to segregate out a particular input or output bonding pad 118 from a cluster to have a direct connection to a tester channel circuit 114a–k.

The test vector generator circuit 128 generally comprises a memory circuit 130 and a counter circuit 132. The memory circuit 130 may be implemented as a random access memory (RAM), a read-only memory (ROM), a write-once-read-many (WORM) memory, a programmable read-only memory (PROM), a volatile memory, a nonvolatile memory, or as any other type of storage device. The counter circuit 130 may be implemented as a resettable binary counter circuit. Other types of counter circuits and memory circuits may be implemented to meet the design criteria of a particular application. Other types of test vector generators, such as state machines, may be implemented to meet the design criteria of a particular application.

In an example implementation, the IC 104 may be a pad-limited die having ample area to incorporate a large ROM memory circuit 130 without adding to the die-area overhead. The large ROM memory circuit 130 may store all or most of the test vectors that may be hard coded inside the IC 104. In another example implementation, the IC 104 may have very limited area for the memory circuit 130. Therefore, a small RAM memory circuit 130 may be implemented to meet a die-space constraint. Generally, a small memory circuit 130 should have (i) a sufficiently large memory depth to store at least one line of a test vector inside the IC 104 and (ii) a mechanism for writing additional test vectors from the tester 102 every few cycles.

Several tester channels 114a–k may be used in a time multiplexed manner to increase a speed of on-chip test vector memory reload thereby reducing a stall time. Generally, within a test cycle there may be multiple cycles of high-speed memory reload and an execution of a test vector at a maximum operational frequency of the IC 104. Memory interleaving may also be employed to reduce a tester stall time while the memory circuit 130 reloads. Another approach to reducing stall time may be to slow down operations of the IC 104 to reduce a rate at which the test vectors are consumed.

The memory circuit 130 may generate and present the test signals TSIN_A–N to the data formatter circuit 126. Timing of the test signals TSIN_A–N may be governed by an address signal (e.g., ADD_A) received by the memory circuit 130. The address signal ADD_A may be generated by the counter circuit 128. The counter circuit 128 may increment the address signal ADD_A based upon the clock signal CLK_A. Therefore, the tester 102 may cause a new test vector to be loaded to the data formatter circuit 126 on each cycle of the clock signal CLK_A.

The data formatter circuit 126 generally comprises multiple multiplexers 134a–n. Each multiplexer 134a–n may generate one of the input signals IN_A–N respectively. The multiplexers 134a–n may generate the input signals IN_A–N based upon the signals PADIN_A–N and the test signals TSIN_A–N. The multiplexers 134a–n may be configured to use the edge transition timing of the signals PADIN_A–N to establish the edge transition timing of the input signals IN_A–N. The multiplexers 134a–n may be further configured to determine an operational mode or a test mode of operation.

Each multiplexer 134a–n may receive a combination of one of the signals PADIN_A–N and one of the signals TSIN_A–H as bits of an address. Each multiplexer 134a–n may also receive multiple signals (e.g., A, B, C and D) for multiplexing based upon the address. The signals A–D may be implemented as predetermined logic levels (e.g., a logical HIGH or a logical LOW), signals from the memory circuit 130, and/or one of the signals PADIN_A–N. Configuring the multiplexers 134a–n may be discussed in further detail below in regards to an example multiplexer shown in FIG. 3.

Testing of the IC 104 may be conducted at a maximum operational frequency or slowed down. Testing at the maximum operational frequency may be performed when constraints for a maximum frequency of the tester 102 (e.g., $f_T$), a derived test rate for the IC 104 (e.g., $f_D$), a maximum error in edge positioning by the tester 102 (e.g., $\Delta_T$), a number of tester channels (e.g., $N_T$ total, $N_{T(I)}$ inputs and $N_{T(O)}$ outputs), a number of IC pins having the same timing information (e.g., $N_D$ total, $N_{D(I)}$ inputs and $N_{D(O)}$ outputs) are compatible. Testing slowed down may be applied to a high-speed, high-pinout digital IC 104 on a lower speed, lower pinout tester 102. A method of slowing the IC 104 during testing may be described by V. D. Agrawal and T. J. Chakraborty in a paper, "High-Performance Circuit Testing with Slow-Speed Testers" IEEE International Test Conference, page 302, 1995, hereby incorporated by reference in its entirety.

Examples of slowed down testing are generally provided as follows. Case (a): Consider there may be k groups or clusters of pins for the IC 104 with $N_{D(k)}$ pins in each group. A number of tester channels 114 used may also equal k (preferably k<<$N_T$). Each tester channel 114 may be used as a timing generator with a (δ, ω) specified uniquely, where δ=a delay and ω=a width of a pulse of the timing generation. With the settings of the internal multiplexers 134a–n determining each group's data format and a vector bit for each channel supplied by the memory circuit 130, testing may proceed at the $f_T$ rate. The tester 102 generally sees the IC 104 as a k-input device under test instead of a $k*N_{D(k)}$-input pin device under test. Case (a) may assume conditions as defined in equations (1), (2) and (3) as follows, where l may be a multiplication factor:

$$f_D / l * f_T \quad \text{Eq. (1)}$$

$$k*l < N_{T(l)} \quad \text{Eq. (2)}$$

$$\frac{1}{l*f_T} >> \Delta_T \quad \text{Eq. (3)}$$

The switching matrix 116 may allow for the test rate for the tester 102 to be generally defined as $1/f_T$ and assign the ($δ_j$, $ω_j$) pairs for l values such that when superimposed the pairs may form the $l*f_T$ repetitive rate. Therefore, the tester 102 may see the IC 104 as a k*l-input device under test running at the frequency $f_T$. Furthermore, the IC 104 may see the tester 102 as a $k*N_D(k)$-input tester running at the frequency $f_D$. A limit for slowing down the test may be reached where $$f_D \approx 1/\Delta_T.$$

Where the conditions of equations (2) or (3) or both are violated, a technique as described in Case (b) may be applied. Case (b) may assume conditions as defined in equations (4) and (5) as follows:

$$f_D / l'*f_T \quad \text{Eq. (4)}$$

$$k*l' > N_{T(l)} \quad \text{Eq. (5)}$$

Using the method of V. D. Agrawal and T. J. Chakraborty reference above, $f_D$ may be changed to $f_D'$ by inserting a delay Δ such that the delay Δ is generally defined as shown in equation (6) as follows:

$$\Delta = \frac{1}{f_D'} - \frac{1}{f_D} \Rightarrow f_D' = \frac{f_D}{1 + \Delta f_D} \quad \text{Eq. (6)}$$

Furthermore, the delay Δ may be assigned such that $f_D'$ satisfies equation (7) as follows:

$$f_D' = l''*f_T \quad \text{Eq. (7)}$$

And:

$$k*l'' < N_{T(l)} \quad \text{Eq. (8)}$$

$$\therefore l'' = \frac{f_D'}{f_T} \quad \text{Eq. (9)}$$

$$\Rightarrow l'' = \frac{\frac{f_D}{f_T}}{1 + \Delta f_D} \quad \text{Eq. (10)}$$

But:

$$k*l'' < N_{T(l)} \quad \text{Eq. (11)}$$

$$\therefore \frac{k \frac{f_D}{f_T}}{N_{T(l)}} < 1 + \Delta f_D \quad \text{Eq. (12)}$$

$$\therefore \Delta > \frac{k \frac{f_D}{f_T} - N_{T(l)}}{f_D * N_{T(l)}} \quad \text{Eq. (13)}$$

The delay Δ may be governed according to equation (14) as follows to simultaneously keep the condition of equation (3) valid:

$$f_D' << \frac{1}{\Delta_T} \quad \text{Eq. (14)}$$

The output side formulae may be derived in exactly the same fashion. The delay Δ may be selected such that the delay Δ is generally the largest value simultaneously satisfying both the input and the output constraints.

Figure 3:
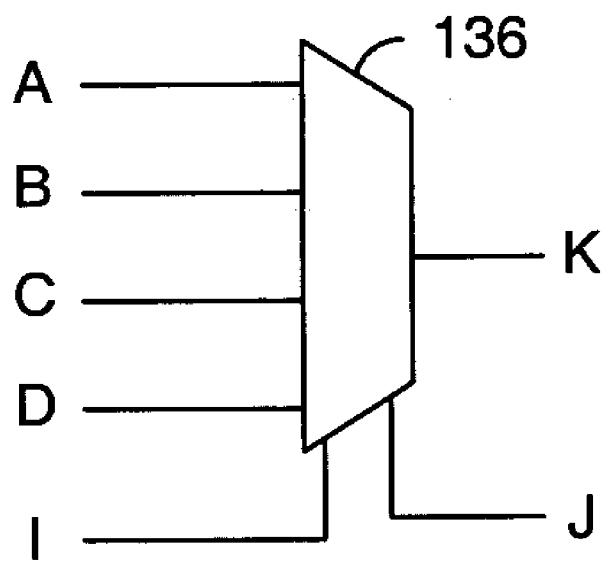
FIG. 3 is a block diagram of an example multiplexer.

Referring to FIG. 3, a block diagram of an example multiplexer 136 is shown. The multiplexer 136 may be implemented as any one or more of the multiplexers 134a–n of the data formatter circuit 120. The multiple signals A, B, C and D may be provide to the multiplexer 136 for multiplexing. Several signals (e.g., I and J) may also be provided to the multiplexer 136 as address signals. The multiplexer 136 may generate and present a signal (e.g., K). The signal K may be a function F of the signals I and J with the function F determined by the signals A, B, C and D. By appropriate selection or programming of the signals A, B, C and D, the output signal K may be any one of sixteen different logic functions of the input signals I and J. Conventional tester channels typically offer only four such logic functions. The sixteen logic functions F are generally shown in TABLE I as follows:

TABLE I

| I | 0 | 0 | 1 | 1 | Function |
|---|---|---|---|---|----------|
| J | 0 | 1 | 0 | 1 | K = F (I,J) |
| ABCD | 0 | 0 | 0 | 0 | False |
|  | 0 | 0 | 0 | 1 | I AND J |
|  | 0 | 0 | 1 | 0 | I AND /J |
|  | 0 | 0 | 1 | 1 | I |
|  | 0 | 1 | 0 | 0 | /I AND J |
|  | 0 | 1 | 0 | 1 | J |
|  | 0 | 1 | 1 | 0 | I XOR J |
|  | 0 | 1 | 1 | 1 | I OR J |
|  | 1 | 0 | 0 | 0 | I NOR J |
|  | 1 | 0 | 0 | 1 | I XNOR J |
|  | 1 | 0 | 1 | 0 | /J |
|  | 1 | 0 | 1 | 1 | I OR /J |
|  | 1 | 1 | 0 | 0 | /I |
|  | 1 | 1 | 0 | 1 | /I OR J |
|  | 1 | 1 | 1 | 0 | I NAND J |
|  | 1 | 1 | 1 | 1 | True |

Referring again to FIG. 2, by equating the multiplexer 136 (FIG. 3) to the multiplexer 134a (FIG. 2), then the signal I may represent the signal PADIN_A, the signal J may represent the signal TSIN_A, and the signal K may represent the signal IN_A. Programming the signals A–D as 0011 from the memory circuit 130 may result in the signal IN_A equaling the signal PADIN_A. The pattern 0011 for the signals A–D may be used for normal operation to pass through the signal PADIN_A directly to the logic chip core circuit 122. Setting the signals A–D to 0101 generally causes the signal IN_A to equal the signal TSIN_A which may be useful for inserting a known test pattern into the logic chip core circuit 122. The signals A–D may be configured as 0001 so that the signal IN_A may be a logical AND of the signals PADIN_A and the signal TSIN_A. With IN_A=PADIN_A AND TSIN_A, the signal IN_A may have a logical value determined by the signal TSIN_A with timing determined by the signal PADIN_A. Other variations for programming the signals A–D may be provided to meet the criteria of a particular application.

Programming similar to that of the multiplexer 134a may be provided for the other multiplexers 134b–n to generate the signals IN_B–N as functions of the signals PADIN_B–N and TSIN_B–N respectively. Each of the multiplexers 134a–n may be programmed identically such that the timing of the signals IN_A–N are identical and determined by the test signal TG_A. In one embodiment, some or all of the multiplexers 134a–n may be programmed differently to provide different functions and different timings among the signals IN_A–N.

Figure 4:
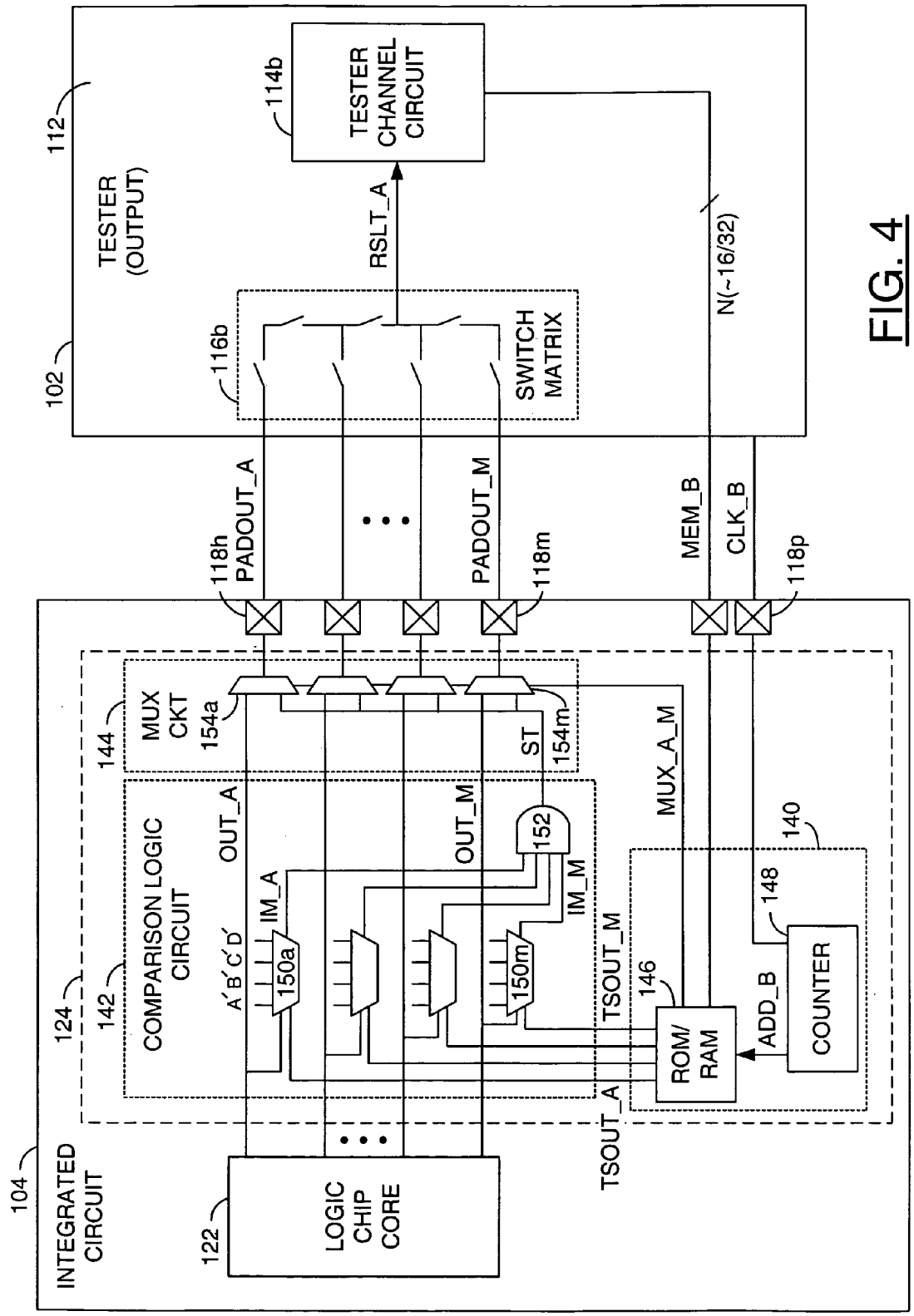
FIG. 4 is a block diagram of an output portion of the integrated circuit.

Referring to FIG. 4, a detailed block diagram of an output portion of the IC 104 is shown. The output circuit 124 of the integrated circuit 104 generally comprises a test vector generator circuit 140, a comparison logic circuit 142 and a multiplexer circuit 144. The test vector generator circuit 140 may provide the IC 104 a built-in self test capability. The comparison logic circuit 142 may support the test vector generator circuit 140 in analyzing information generated by the logic chip core circuit 122 during testing. The multiplex circuit 144 may provide for routing of the test results determined by the comparison logic circuit 142 to the tester 102 through one or more bonding pads 118h–m.

The test vector generator circuit 140 may receive a clock signal from the tester 102, for example the clock signal CLK_B. The test vector generator circuit 140 may also receive a memory signal from the tester 102, for example the memory signal MEM_B. The memory signal MEM_B may be used to write test vector information into the test vector generator circuit 140 from the tester 102. The clock signal CLK_B may provide support for writing the test vector information.

The test vector generator circuit 140 may generate multiple test signals (e.g., TSOUT_A through TSOUT_M). The test vector generator circuit 140 may also generate multiple control signals (e.g., MUX_A through MUX_M). The test signals TSOUT_A–M may convey the test vectors stored in the test vector generator circuit 140 to the comparison logic circuit 142. The control signals MUX_A through MUX_M may be a part of the test vector or may be conditionally generated during a test mode. Timing of the test signals TSOUT_A–M and the control signals MUX_A–M may be determined by the clock signal CLK_B.

The comparison logic circuit 142 may be configured to compare the output signals OUT_A–M with the test signals TSOUT_A–M to generate a status signal (e.g., ST). Generally, the status signal ST may be (i) in a first or pass state while a selected function of data in the output signals OUT_A–M and the test vectors in the test signals TSOUT_A–M produce a true result and (ii) in a second or fail state otherwise. The multiplex circuit 144 may control multiplexing of the output signals OUT_A–M with the status signal ST to generate the signals PADOUT_A–M. Control of the multiplexing may be provided by the test vector generator circuit 140 through the control signals MUX_A–M.

The test vector generator circuit 140 generally comprises a memory circuit 146 and a counter circuit 148. The memory circuit 146 may be implemented as a random access memory (RAM), a read-only memory (ROM), a write-once-read-many (WORM) memory, a programmable read-only memory (PROM), a volatile memory, a nonvolatile memory, or as any other type of storage device. The counter circuit 148 may be implemented as a resettable binary counter circuit. Other types of counter circuits or state machines and memory circuits may be implemented to meet the design criteria of a particular application.

Similar to the memory circuit 130, the memory circuit 146 may be a large or small depending upon the available area in the integrated circuit 104. A small memory circuit 146 should have (i) a sufficiently large memory depth to store at least one line of a test vector inside the IC 104 and (ii) a mechanism for writing additional test vectors from the tester 102 every few cycles. Several tester channels 114a–k may be used in a time multiplex manner to increase a speed of on-chip test vector memory reload thereby reducing a stall time.

The memory circuit 146 may generate and present the test signals TSOUT_A–M to the comparison logic circuit 142 and the control signals MUX_A–M the multiplex circuit 144. Timing of the test signals TSOUT_A–M and the control signals MUX_A–M may be governed by an address signal (e.g., ADD_B) received by the memory circuit 146. The address signal ADD_B may be generated by the counter circuit 148. The counter circuit 148 may increment the address signal ADD_B based upon the clock signal CLK_B. Therefore, the tester 102 may cause a new test vector to be loaded to the comparison logic circuit 142 on each cycle of the clock signal CLK_B.

The comparison logic circuit 142 generally comprises multiple multiplexers 150a–m and a logic gate 152. Each of the multiplexers 150a–m may have an address input coupled to the logic chip core circuit 122 to receive one of the output signal OUT_A–M and another address input coupled to the test vector generator circuit 140 to receive one of the test signals TSOUT_A–M. Several signals may be provided to each of the multiplexers 150a–m to control selection of a function performed by the multiplexers 150. Furthermore, each multiplexer 150a–m may generate an intermediate signal (e.g., IM_A through IM_M).

By way of example, the multiplexer 150a may receive multiple signals (e.g., A'. B', C' and D'). The other multiplexers 150b–m may receive the same or similar signals. The signals A', B', C' and D' may be generated and presented by the memory circuit 146, as external signals, or from other internal signals. The signals A'–D' may operate on the multiplexer 150a similar to the signals A–D on the multiplexer 136 (FIG. 3). Equating the multiplexer 136 to the multiplexer 150a, then the signal I may be represented by the signal OUT_A, the signal J may be represented by the signal TSOUT_A, and the signal K may be represented by the signal IM_A. Programming the signal A'–D' as 1001 may result in the signal IM_A equaling an exclusive NOR function of the signals OUT_A and the signal TSOUT_A.

Therefore, the signal IM_A may have a logical high value only if the signal OUT_A matches the signal TSOUT_A. Setting the input signals to the other multiplexers 150b–m to the same pattern of 1001 may result in the status signal ST having (i) a logical one value only if all of the signals OUT_A–M match all of the respective signals TSOUT_A–M and (ii) a logical zero otherwise.

Programming of the multiplexers 150b–m may be identical to the programming of the multiplexer 150a through the signals A'–D'. For example, all multiplexers 150a–m may be programmed with 1111 or 0000 for normal operations such that the signals IM_A–M are held true or false and do not toggle as the signals OUT_A–M toggle. In one embodiment, one or more of the multiplexer 150a–m may be programmed differently from the remaining multiplexers 150 to generate different functions for the respective signals IM_A–M.

The intermediate signals IM_A–M may be received by the logic gate 152. The logic gate 152 may be implemented as an AND gate. The AND gate 152 may logically AND each of the intermediate signals IM_A–M to generate and present the status signal ST. Therefore, the status signal ST may represent the pass state or the logical HIGH value while the values in each of the output signals OUT_A–M match the test vector in the test signals TSOUT_A–M, otherwise the status signal ST may represent the fail state or the logical LOW value.

The multiplex circuit 144 generally comprises multiple multiplexers 154a–m. The multiplexers 154a–m may receive the control signals MUX_A–M as address signals. Each multiplexer 154a–m may receive one of the output signals OUT_A–M and the status signal ST for multiplexing to the signals PADOUT_A–M. Each multiplexer 154a–m may be controlled individually by the control signals MUX_A–M to allow the status signal ST to be multiplexed into any one or more of the signals PADOUT_A–M. In one embodiment, a single control signal, for example MUX_A, may control all of the multiplexers 154a–m simultaneously. Therefore, the multiplex circuit 144 may select either (i) the output signals OUT_A–M in an operational mode or parametric test mode or (ii) multiple copies of the status signal ST in a test mode as addressed by the control signal MUX_A.

The switching matrix 116b may be useful in reducing a number of tester channels 114a–k used to read data from the IC 104. Numbers of output signals PADOUT_A–M having similar timing per a design of the IC 104 may be grouped together in one or more clusters with help from the switching matrix 116b. Therefore, the result signal RSLT_A with timing information for a cluster of pins may be received by the tester channel 114b for evaluation. Likewise, multiple sets of clusters may generate multiple signals RSLT_A–L to multiple tester channels 114a–k for evaluation.

Figure 5:
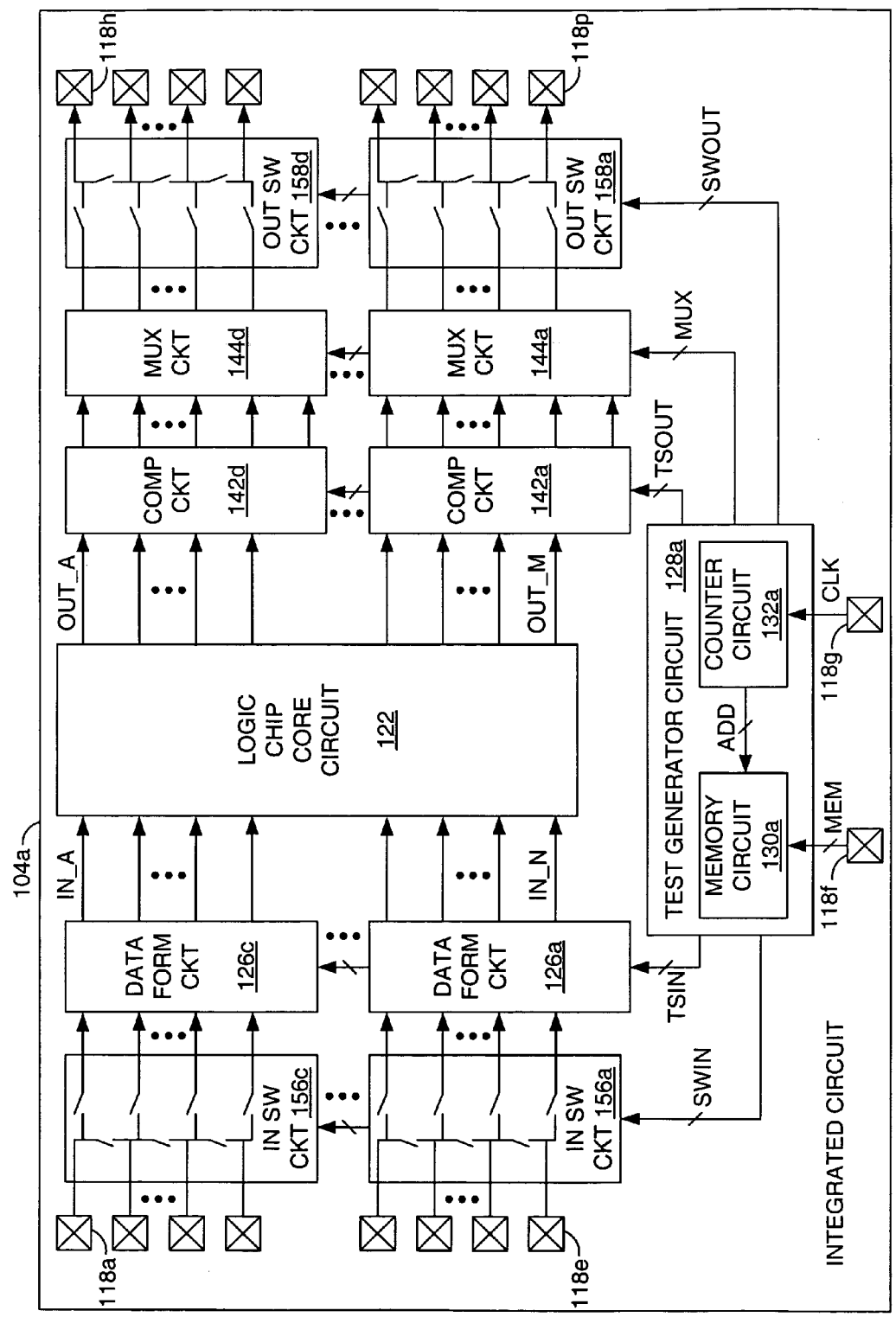
FIG. 5 is a block diagram of another embodiment of the integrated circuit.

Referring to FIG. 5, a block diagram of a second example embodiment of an integrated circuit 104a is shown. The IC 104a generally comprises the bonding pads 118a–p, the logic chip core circuit 122, multiple data formatter circuits 126a–c, multiple comparison circuits 142a–d, multiple multiplex circuit 144a–d, a single test vector generator circuit 128a, multiple input switching circuits 156a–c and multiple output switching circuits 158a–d. Implementation of multiple data formatter circuit 126a–c generally allows for multiple independent clusters to be defined for the input signals IN_A–N. Multiple comparison logic circuits 142a–d and multiple multiplex circuit 144a–d generally allow for multiple independent clusters to be defined for the output signals OUT_A–M.

The test vector generator circuit 128a may provide for storage of all test vectors for both input test signal generation and output signal comparison functions. Use of the single test vector generator 128a generally simplifies interfacing the memory signal MEM to the tester 102 (FIG. 1) to load a memory circuit 130a. A single interface for a clock signal CLK may be implemented to cycle a counter circuit 132a.

Other variations of the test vector generator circuit may be implemented to meet the design criteria of a particular implementation. For example, an integrated circuit design may incorporate N independent test vector generator circuits where N may be an integer of one or greater up to a sum of the independent data formatter circuits 126a–c, the input switching circuits 156a–c, the comparison circuits 142a–d, the multiplex circuits 144a–d, and the output switching circuits 158a–d. Multiple test vector generator circuits generally allow independent test vector loading and clocking for different clusters of the input signals IN_A–N and the output signals OUT_A–M to and from the logic chip core circuit 122.

The input switching circuits 156a–c may be implemented as unidirectional and/or bidirectional switching matrices. Individual switching elements may be fabricated using silicon devices, micro-electro-mechanical systems (MEMS) and/or other technologies compatible with the integrated circuit fabrication technology. The input switching circuit 156a–c may provide for interconnecting the input bonding pads 118 from within the IC 104a. Control of the input switching circuits 156a–c may be provided by a multiple-bit control signal (e.g., SWIN). The test vector generator 128a may generate and present the control signal SWIN based upon the stored test vectors. As a result, the complexity of the tester 102 (FIG. 1) may be simplified as only one connection to one input bonding pad 118 may be made for each cluster of input signals.

The output switching circuits 158a–d may be implemented as unidirectional and/or bidirectional switching matrices. Individual switching elements may be fabricated using silicon devices, MEMS and/or other technologies compatible with the integrated circuit fabrication technology. The output switching circuits 158a–d may provide for interconnecting the output bonding pads 118 from within the IC 104a. Control of the output switching circuits 158a–d may be provided by a multiple-bit control signal (e.g., SWOUT). The test vector generator 128a may generate and present the control signal SWOUT based upon the stored test vectors. Therefore, the tester 102 (FIG. 1) may only be connected to one output bonding pad 118 for each cluster of output signals.

An integrated circuit 104 for a third example embodiment may implement one or more input circuits 120 without implementing any output circuit 124. The input circuit 120 may provide for inserting testing patterns into the logic chip core circuit 122. A conventional tester 102 configuration may be provided to analyze the results.

An integrated circuit 104 for a fourth example embodiment may implement one or more output circuits 124 without implementing any input circuits 120. The output circuits 124 may provide for on-chip analysis of the logic chip core circuit 122 in clusters. A conventional tester 102 configuration may be provided to generate the input signals IN_A–N to the logic chip core circuit 122. Other combinations of the input circuits 120, the output circuits 124, conventional test vector generation and convention results analysis may be implemented to meet the design criteria of a particular application.

The input circuits 120 and the output circuit 124 may provide several advantages to testing a large pinout integrated circuit 104. The advantages include, but are not limited to testing with a lower number of channels and with less additional switches and/or jumpers on test-boards of the tester 102. The present invention may keep the timing generator as a part of the tester 102 and create the data formatting and the comparison logic in the device under test without compromising on the DC and AC parametric testing or functional testing. Optimum use may be made of the tester channels by time-multiplexing the tester channel circuits 114 for loading the test vector patterns into the memory and/or memories of the on-chip test vector generators. The memory circuit or circuits may be implemented as a ROM for internal test pattern coding in very large pad-limited integrated circuits 104. The memory circuit or circuits may be implemented as a RAM where chip area may be constrained. Individual bonding pad DC or AC parameter testing may be performed with fewer tester 102-bonding pad 118 interfaces, without slowing down the tester 102, by switching grouped or clustered outputs to different bonding pads 118 within the set of test vectors. Furthermore, the present invention may extend tester life to several generations of integrated circuits by reducing the number of tester channels used to test future integrated circuits adequately.

The various signals of the present invention may be implemented as single-bit or multi-bit signals in a serial and/or parallel configuration. The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, invertors, tri-state buffers or the like may be added to change a particular polarity and/or levels of the signals.

As used herein, the term "simultaneously" is generally meant to describe events that share some common time period but the term is generally not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

What is claimed is:

1. An integrated circuit comprising:
   a plurality of input pads configured to receive a plurality of first input signals;
   an input circuit configured to generate a plurality of second input signals (i) equal to said first input signals while in an operational mode and (ii) responsive to a plurality of test vectors with timing generation determined by said first input signals while in a test mode, wherein said input circuit comprises a data formatter configured to generate said second input signals in response to said first input signals and a plurality of test signals conveying said test vectors; and
   a core circuit configured to (i) directly receive said second input signals and (ii) respond to said second input signals.

2. The integrated circuit according to claim 1, wherein said data formatter comprises a plurality of multiplexers addressed by said first input signals and said test signals.

3. The integrated circuit according to claim 2, wherein said multiplexers are configurable to provide greater than four different logic functions.

4. The integrated circuit according to claim 3, wherein said multiplexers are configurable between (i) an AND function and (ii) a pass through function.

5. The integrated circuit according to claim 1, wherein said input circuit comprises a test vector generator configured to generate a plurality of test signals in response to a clock signal.

6. The integrated circuit according to claim 5, wherein said test vector generator comprises a memory configured to (i) store said test vectors and (ii) generate said test signals in response to said test vectors and an address signal.

7. The integrated circuit according to claim 6, wherein said test vector generator further comprises a counter configured to generate said address signal in response to said clock signal.

8. The integrated circuit according to claim 1, wherein said input circuit comprises a switching matrix configured to interconnect said input pads in response to a control signal.

9. The integrated circuit according to claim 8, wherein said input circuit further comprises a memory configured to (i) store said test vectors and (ii) generate said control signal in response to said test vectors.

10. The integrated circuit according to claim 1, further comprising:
    an output circuit configured to (i) generate a plurality of second output signals equal to a plurality of first output signals generated by said core circuit while said output circuit has said operational mode and (ii) generate one of said second output signals in response to a comparison result of data in said first output signals to said test vectors while in said test mode; and
    a plurality of output pads configured to directly receive said second output signals.

11. An integrated circuit comprising:
    a core circuit configured to generate a plurality of first output signals;
    an output circuit configured to (i) generate a plurality of second output signals equal to said first output signals while in an operational mode and (ii) generate one of said second output signals in place of one of said first output signals in response to a comparison result of data in said first output signals to a plurality of test vectors while in a test mode; and
    a plurality of output pads configured to receive said second output signals.

12. The integrated circuit according to claim 11, wherein said output circuit comprises a comparison circuit configured to generate a status signal conveying said comparison result in response to comparing said first output signals to a plurality of test signals conveying said test vectors.

13. The integrated circuit according to claim 12, wherein said comparison circuit comprises a plurality of multiplexers configured to generate a plurality of intermediate signals in response to said first output signals and said test signals.

14. The integrated circuit according to claim 13, wherein said comparison circuit further comprises a logic gate configured to generate said status signal in response to said intermediate signals.

15. The integrated circuit according to claim 12, wherein said output circuit comprises a switching circuit configured to interconnect said output pads in response to a control signal.

16. The integrated circuit according to claim 15, wherein said output circuit further comprises a memory configured to (i) store said test vectors and (ii) generate said control signal in response to said test vectors.

17. The integrated circuit according to claim 11, wherein said output circuit comprises a multiplex circuit configured to generate said second output signals in response to said first output signals and a status signal conveying said comparison result.

18. The integrated circuit according to claim 17, wherein said multiplex circuit comprises a plurality of multiplexers configured to multiplex said first output signals and said status signal into said second output signals.

19. An integrated circuit comprising:

means for receiving a plurality of first input signals using a plurality of input pads;

means for generating a plurality of second input signals (i) equal to said first input signals while in an operational mode and (ii) responsive to a plurality of test vectors with timing generation of said second input signals determined by said first signals while in a test mode, wherein said means for generating a plurality of second input signals comprises a data formatter configured to generate said second input signals in response to said first input signals and a plurality of test signals conveying said test vectors; and means responsive to said second input signals using a core circuit configured to directly receive said second input signals.

* * * * *